(12) United States Patent
Wang et al.

(10) Patent No.: US 12,287,385 B2
(45) Date of Patent: Apr. 29, 2025

(54) SYSTEMS AND METHODS OF NOISE REDUCTION IN MAGNETIC RESONANCE IMAGES

(71) Applicant: GE PRECISION HEALTHCARE LLC, Wauwatosa, WI (US)

(72) Inventors: Kang Wang, Sussex, WI (US); Robert Marc Lebel, Calgary (CA)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 432 days.

(21) Appl. No.: 17/727,206

(22) Filed: Apr. 22, 2022

(65) Prior Publication Data

US 2023/0341490 A1  Oct. 26, 2023

(51) Int. Cl.
  *G01R 33/48* (2006.01)
  *G01R 33/56* (2006.01)
  *G01R 33/561* (2006.01)
  *G01R 33/565* (2006.01)
  (Continued)

(52) U.S. Cl.
  CPC ..... *G01R 33/4828* (2013.01); *G01R 33/4818* (2013.01); *G01R 33/5608* (2013.01); *G01R 33/5612* (2013.01); *G01R 33/56554* (2013.01); *G06T 11/008* (2013.01); *G06V 10/82* (2022.01)

(58) Field of Classification Search
  CPC ............ G01R 33/4828; G01R 33/4818; G01R 33/5608; G01R 33/5612; G01R 33/56554; G01R 33/565; G06T 11/008; G06T 5/50; G06T 2207/10088; G06T 2207/20081; G06T 2207/20084; G06T 2207/30004;
  (Continued)

(56) References Cited

U.S. PATENT DOCUMENTS

| 10,635,943 B1 | 4/2020 | Lebel et al. |
| 10,776,925 B2 | 9/2020 | Zhang |
| 2020/0126190 A1 | 4/2020 | Lebel |

(Continued)

OTHER PUBLICATIONS

Hahn et al., "Image Quality and Diagnostic Performance of Accelerated Shoulder MRI With Deep Learning-Based Reconstruction", American Journal of Roentgenology 2022 218:3, 506-516, doi: 10.2214/AJR.21.26577.

(Continued)

*Primary Examiner* — Ping Y Hsieh
*Assistant Examiner* — Vaisali Rao Koppolu
(74) *Attorney, Agent, or Firm* — Armstrong Teasdale LLP

(57) ABSTRACT

A computer-implemented method of reducing noise in magnetic resonance (MR) images is provided. The method includes executing a neural network model of analyzing MR images, wherein the neural network model is trained with a pair of pristine images and corrupted images. The pristine images are the corrupted images with noise reduced, and target output images of the neural network model are the pristine images. The method also includes receiving first MR signals and second MR signals, reconstructing first and second MR images based on the first MR signals and the second MR signals, and analyzing the first MR image and the second MR image using the neural network model. The method further includes deriving a denoised MR image based on the analysis, wherein the denoised MR image is a combined image based on the first MR image and the second MR image and outputting the denoised MR image.

20 Claims, 6 Drawing Sheets

(51) Int. Cl.
*G06T 11/00* (2006.01)
*G06V 10/82* (2022.01)

(58) Field of Classification Search
CPC ... G06V 10/82; G06V 2201/033; G06V 10/30
See application file for complete search history.

(56) References Cited

U.S. PATENT DOCUMENTS

| | | | | |
|---|---|---|---|---|
| 2021/0123999 | A1* | 4/2021 | An | G01R 33/56308 |
| 2021/0302522 | A1* | 9/2021 | Zhong | G06T 5/50 |
| 2021/0302525 | A1* | 9/2021 | Mandava | G06T 7/0012 |
| 2022/0026516 | A1* | 1/2022 | Guidon | G01R 33/565 |
| 2022/0107378 | A1* | 4/2022 | Dey | G06N 3/08 |
| 2023/0126958 | A1* | 4/2023 | Hamanaga | G01R 33/56554 |
| | | | | 324/309 |
| 2023/0342885 | A1* | 10/2023 | Zhao | G06T 5/70 |
| 2024/0094320 | A1* | 3/2024 | Eggers | G01R 33/4828 |

OTHER PUBLICATIONS

Hammernik et al., "Learning a variational network for reconstruction of accelerated MRI data", Magnet Reson Med 2018;79:3055-3071 doi: 10.1002/mrm.26977.

Kidoh et al., "Deep Learning Based Noise Reduction for Brain MR Imaging: Tests on Phantoms and Healthy Volunteers", Magn Reson Med Sci 2020;19:195-206 doi: 10.2463/mrms.mp.2019-0018.

Kim et al., "Thin-slice Pituitary MRI with Deep Learning-based Reconstruction", Radiology 2021 298:1, 114-122, doi: 10.1148/radiol.2020200723.

Lebel, "Performance characterization of a novel deep learning-based MR image reconstruction pipeline", Arxiv 2020.

Lee et al., "Deep learning-based thin-section MRI reconstruction improves tumour detection and delineation in pre- and post-treatment pituitary adenoma", Sci Rep 11, 21302 (2021). https://doi.org/10.1038/s41598-021-00558-2.

Muscogiuri et al., "Feasibility of late gadolinium enhancement (LGE) in ischemic cardiomyopathy using 2D-multisegment LGE combined with artificial intelligence reconstruction deep learning noise reduction algorithm", vol. 343, p. 164-170, Sep. 10, 2021, https://doi.org/10.1016/j.ijcard.2021.09.012.

Sneag et al., "Prospective respiratory triggering improves high-resolution brachial plexus MRI quality", J Magnetic Reson Imaging Jmri 2018;49:1723-1729 doi: 10.1002/jmri.26559.

Van der Velde et al., "Improvement of late gadolinium enhancement image quality using a deep learning-based reconstruction algorithm and its influence on myocardial scar quantification", Eur Radiol 31, 3846-3855 (2021), https://doi.org/10.1007/s00330-020-07461-w.

Wang et al., "Novel deep learning-based noise reduction technique for prostate magnetic resonance imaging", Abdom Radiol 46, 3378-3386 (2021), https://doi.org/10.1007/s00261-021-02964-6.

\* cited by examiner

SYSTEMS AND METHODS OF NOISE REDUCTION IN MAGNETIC RESONANCE IMAGES

BACKGROUND

The field of the disclosure relates generally to systems and methods of image processing, and more particularly, to systems and methods of noise reduction in medical images using a neural network model.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Noise and artifacts in MR images affect image quality of the images and therefore may interfere with diagnosis. Known methods are disadvantaged in some aspects and improvements are desired.

BRIEF DESCRIPTION

In one aspect, a computer-implemented method of reducing noise in magnetic resonance (MR) images is provided. The method includes executing a neural network model of analyzing MR images, wherein the neural network model is trained with a pair of pristine images and corrupted images, wherein the pristine images are the corrupted images with noise reduced, and target output images of the neural network model are the pristine images. The method also includes receiving first MR signals and second MR signals, reconstructing a first MR image and a second MR image based on the first MR signals and the second MR signals, and analyzing the first MR image and the second MR image using the neural network model. The method further includes deriving a denoised MR image based on the analysis, wherein the denoised MR image is a combined image based on the first MR image and the second MR image and outputting the denoised MR image.

In another aspect, an MR noise reduction system is provided. The system includes a noise reduction computing device, which includes at least one processor in communication with at least one memory device. The at least one processor is programmed to execute a neural network model of analyzing MR images, wherein the neural network model is trained with a pair of pristine images and corrupted images, wherein the pristine images are the corrupted images with noise reduced, and target output images of the neural network model are the pristine images. The at least one processor is also programmed to receive first MR signals and second MR signals, reconstruct a first MR image and a second MR image based on the first MR signals and the second MR signals, and analyze the first MR image and the second MR image using the neural network model. The at least one processor is further programmed to derive a denoised MR image based on the analysis, wherein the denoised MR image is a combined image based on the first MR image and the second MR image, and output the denoised MR image.

DRAWINGS

DETAILED DESCRIPTION

The disclosure includes systems and methods of reducing noise in magnetic resonance (MR) images of a subject. As used herein, a subject is a human, an animal, or a phantom, or part of a human, an animal, or a phantom, such as an organ or tissue. Noise, artifacts, other undesired signals, or any combination thereof is collectively referred to as noise. Artifacts may be caused by eddy currents, physiological noise, $B_0$ drifts, $B_0$ and/or $B_1$ inhomogeneity, or other system imperfections. Compared to a corrupted image, a pristine image is an image with noise reduced. Reducing or removing noise is collectively referred to as reducing noise or denoising. A denoised image is an image having noise reduced. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as $B_0$ and extends in the longitudinal or z direction. In acquiring an MRI image, a magnetic field (referred to as an excitation field $B_1$), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal $B_1$ is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
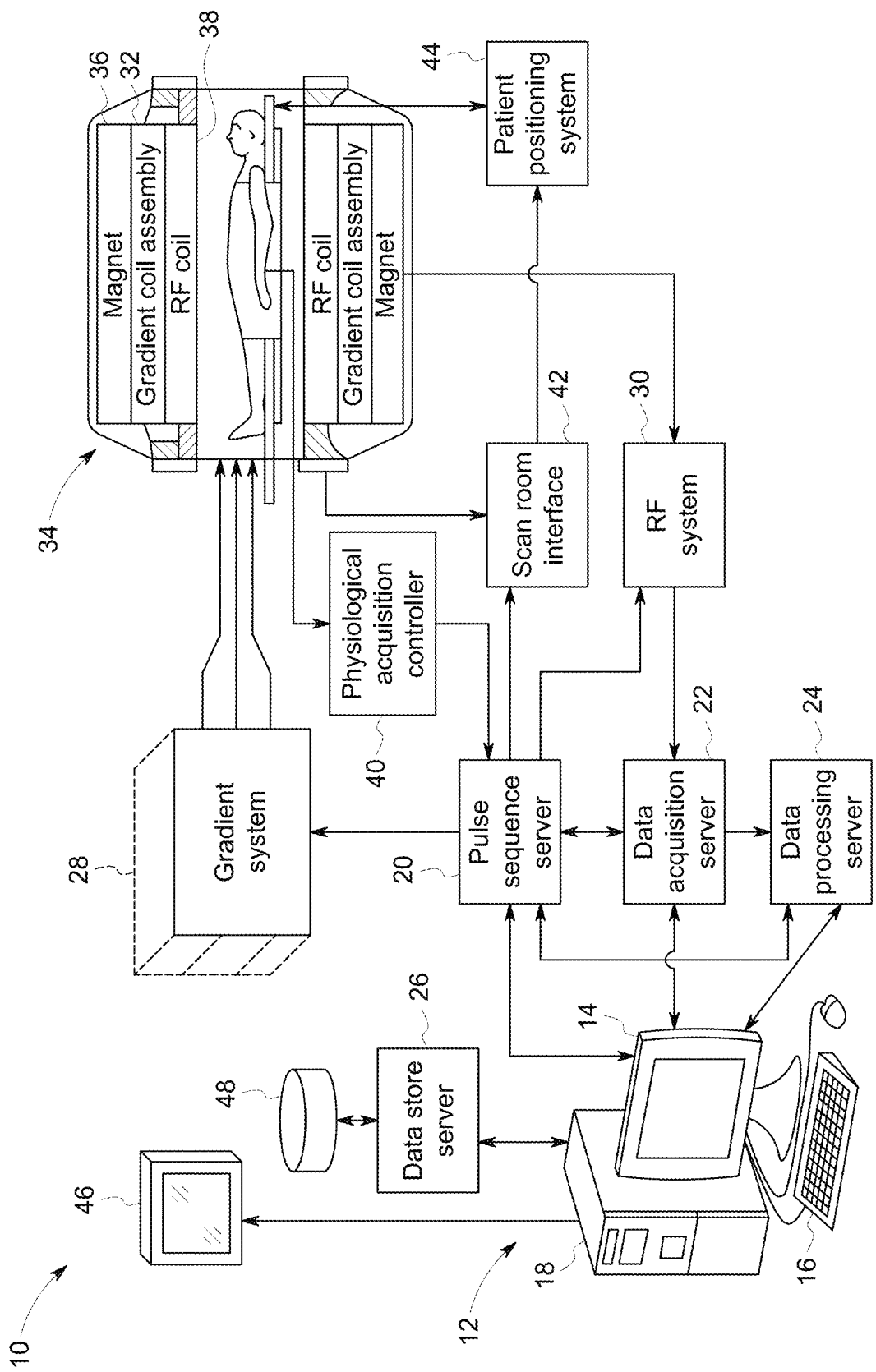
FIG. 1 is a schematic diagram of an exemplary magnetic resonance imaging (MRI) system.

FIG. 1 illustrates a schematic diagram of an exemplary MRI system 10. In the exemplary embodiment, MRI system 10 includes a workstation 12 having a display 14 and a keyboard 16. Workstation 12 includes a processor 18, such as a commercially available programmable machine running a commercially available operating system. Workstation 12 provides an operator interface that allows scan prescriptions to be entered into MRI system 10. Workstation 12 is coupled to a pulse sequence server 20, a data acquisition server 22, a data processing server 24, and a data store server 26. Workstation 12 and each server 20, 22, 24, and 26 communicate with each other.

In the exemplary embodiment, pulse sequence server 20 responds to instructions downloaded from workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. RF coil 38 is shown as a whole body RF coil. RF coil 38 may also be a local coil that may be placed in proximity to the anatomy to be imaged, or a coil array that includes a plurality of coils.

In the exemplary embodiment, gradient waveforms used to perform the prescribed scan are produced and applied to gradient system 28, which excites gradient coils in gradient coil assembly 32 to produce the magnetic field gradients $G_x$, $G_y$, and $G_z$ used for position-encoding MR signals. Gradient coil assembly 32 forms part of a magnet assembly 34 that also includes a polarizing magnet 36 and RF coil 38.

In the exemplary embodiment, RF system 30 includes an RF transmitter for producing RF pulses used in MR pulse sequences. The RF transmitter is responsive to the scan prescription and direction from pulse sequence server 20 to produce RF pulses of a desired frequency, phase, and pulse amplitude waveform. The generated RF pulses may be applied to RF coil 38 by RF system 30. Responsive MR signals detected by RF coil 38 are received by RF system 30, amplified, demodulated, filtered, and digitized under direction of commands produced by pulse sequence server 20. RF coil 38 is described as a transmitter and receiver coil such that RF coil 38 transmits RF pulses and detects MR signals. In one embodiment, MRI system 10 may include a transmitter RF coil that transmits RF pulses and a separate receiver coil that detects MR signals. A transmission channel of RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, RF system 30 also includes one or more RF receiver channels. Each RF receiver channel includes an RF amplifier that amplifies the MR signal received by RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M=\sqrt{I^2+Q^2} \qquad (1);$$

and the phase of the received MR signal may also be determined as in Eq. (2) below:

$$\varphi = \tan^{-1}\left(\frac{Q}{I}\right). \qquad (2)$$

In the exemplary embodiment, the digitized MR signal samples produced by RF system 30 are received by data acquisition server 22. Data acquisition server 22 may operate in response to instructions downloaded from workstation 12 to receive real-time MR data and provide buffer storage such that no data is lost by data overrun. In some scans, data acquisition server 22 does little more than pass the acquired MR data to data processing server 24. In scans that need information derived from acquired MR data to control further performance of the scan, however, data acquisition server 22 is programmed to produce the needed information and convey it to pulse sequence server 20. For example, during prescans, MR data is acquired and used to calibrate the pulse sequence performed by pulse sequence server 20. Also, navigator signals may be acquired during a scan and used to adjust the operating parameters of RF system 30 or gradient system 28, or to control the view order in which k-space is sampled.

In the exemplary embodiment, data processing server 24 receives MR data from data acquisition server 22 and processes it in accordance with instructions downloaded from workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by data processing server 24 are conveyed back to, and stored at, workstation 12. In some embodiments, real-time images are stored in a database memory cache (not shown in FIG. 1), from which they may be output to operator display 14 or a display 46 that is located near magnet assembly 34 for use by attending physicians. Batch mode images or selected real time images may be stored in a host database on disc storage 48 or on a cloud. When such images have been reconstructed and transferred to storage, data processing server 24 notifies data store server 26. Workstation 12 may be used by an operator to archive the images, produce films, or send the images via a network to other facilities.

In known methods using a neural network model, the neural network model is typically trained for performing a target operation or producing target results. For example, for Dixon fat suppression, two or more images are used to generate a water-only image with a fat signal suppressed. In a known method using a neural network model, during training, the two or more images in training datasets are provided as inputs of the neural network model and corresponding water-only images as outputs of the neural network model. That is, the neural network model is specifically trained for the specific task of combining the two or more images. In other known methods, a trained neural network is typically used to analyze original images, which are the same as the images in the training datasets, and is not used to analyze derived images of the original images. For example, the neural network model is trained with noisy MR images and MR images with reduced noise, and the trained neural network model is used to analyze original MR images acquired from MR scanners to reduce noise in the images, rather than being used to analyze derived images of the original MR images.

In contrast, in the systems and methods disclosed herein, the neural network model may be a pre-existing trained model, and is not specifically trained with the datasets used or for the operation performed during analysis using the neural network model. As used herein, a dataset includes images, MR signals, or any combination thereof. For example, the neural network model is trained to reduce noise in images. The training datasets may be different from datasets for inference. The input images during inference may be derived images or processed images of original images. The original images may have different noise distribution among them. Further, the neural network model is not trained to perform the operation for generating derived images. In addition, the neural network model may take complex signals or images as inputs, increasing the accuracy in inference.

Figure 2A:
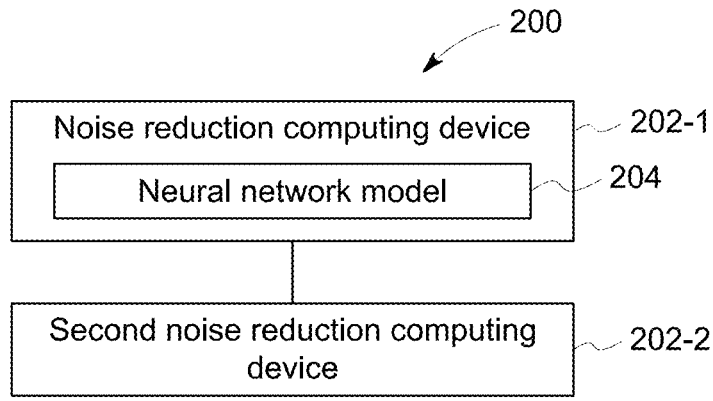
FIG. 2A is an exemplary noise reduction system.

FIG. 2A is a schematic diagram of an exemplary noise reduction system 200. In the exemplary embodiment, system 200 includes a noise reduction computing device 202-1 configured to reduce noise in an MR image. Computing device 202-1 further includes a neural network model 204. System 200 may include a second noise reduction computing device 202-2. Second noise reduction computing device 202-2 may be used to train neural network model 204, and noise reduction computing device 202-1 may then use trained neural network model 204. Second noise reduction computing device 202-2 may be the same computing device as noise reduction computing device 202-1 such that the training and use of neural network model 204 are on one computing device. Alternatively, second noise reduction computing device 202-2 may be a computing device separate from noise reduction computing device 202-1 such that the training and use of neural network model 204 are executed on separate computing devices. Noise reduction computing device 202 may be included in workstation 12 of MRI system 10, or may be included on a separate computing device that is in communication with workstation 12. In one example, noise reduction computing device 202 is a server computing device, and may be cloud-based.

Figure 2B:
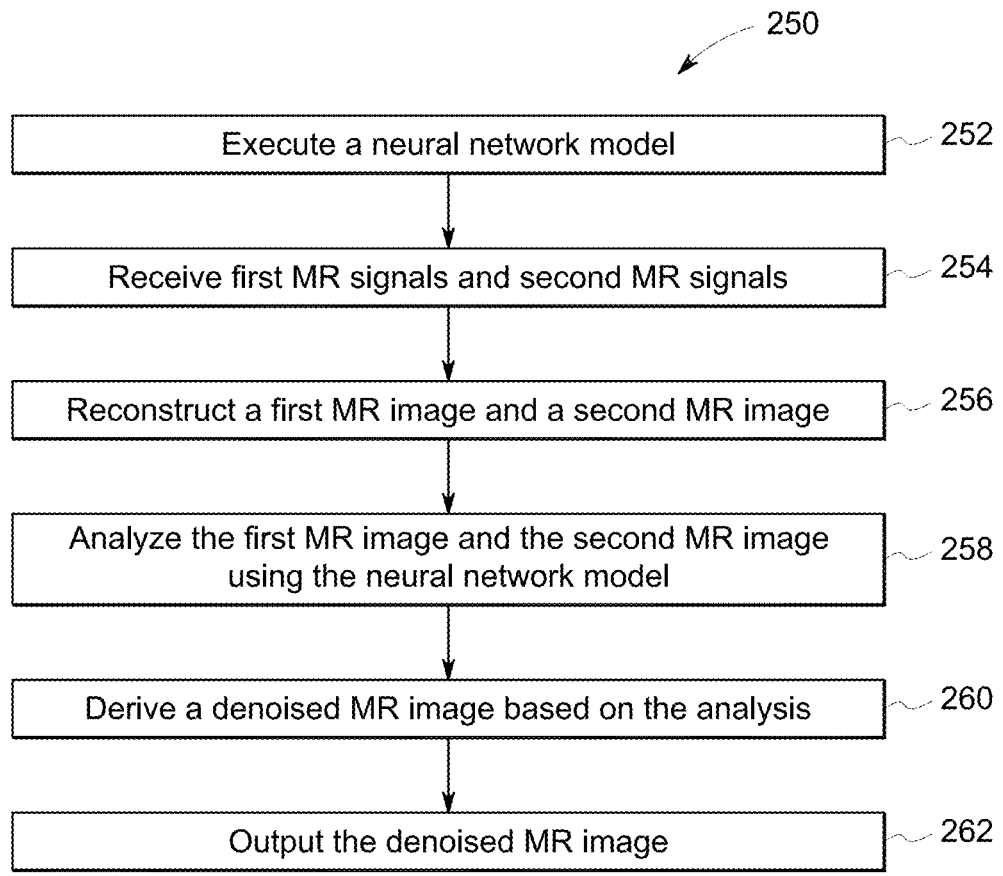
FIG. 2B is a flow chart of an exemplary method of reducing noise.

FIG. 2B is a flow chart of an exemplary method 250. Method 250 may be implemented on noise reduction system 200. In the exemplary embodiment, method 250 includes executing 252 a neural network model of analyzing MR images. The neural network model is trained with training datasets. The training datasets may be training images, which may be a pair of pristine images and corrupted images, and the target output images of the neural network model are the pristine images. The pristine images are the corrupted images with noise reduced. The training images are represented in any format such as complex MR images, phase images, real and imaginary pairs, images in a phasor representation, or magnitude images. In some embodiments, the corrupted images are simulated images contaminated with artifacts and/or noise, and the pristine images are the simulated phase images without the contamination. The training images may be images contaminated with simulated noise from a heterogeneous dataset, which may be from different applications, and/or acquired with different pulse sequences and/or different pulse sequence parameters. Trained neural network model 204 is configured to reduce noise in an input image and output an image having reduce noise.

Method 250 further includes receiving 254 first MR signals and second MR signals. A first MR image and a second MR image are reconstructed 256 based on the first MR signals and the second MR signals. The first and second MR images are analyzed 258 using the neural network model. A denoised MR image is derived 260 based on the analysis. The denoised MR image is a combined image based on the first MR image and the second MR image. The denoised MR image is output 262.

In the exemplary embodiment, method 250 is used in Dixon chemical shift imaging (CSI). In some applications, fat suppression is desired, where signals from fat are suppressed. Fat suppression may be accomplished by applying a fat saturation pulse before applying an excitation pulse. Fat suppression using a fat saturation pulse may fail due to $B_0$ inhomogeneity. Using an inversion recovery pulse is another method of fat suppression, where an inversion recover pulse is applied and images are acquired when the fat signal is nulled during the inversion recovery. Compared to the fat saturation method, the inversion recovery method is relatively insensitive to $B_0$ inhomogeneity but is sensitive to $B_1$ inhomogeneity, the signal to noise ratio (SNR) of the image is low, and the contrast changes may not be desirable. In areas having high $B_0$ inhomogeneity, such as brachial plexus or off-center slices, the fat saturation method, or even the inversion recovery method, may fail. The Dixon CSI is advantageous in suppressing the fat signal because MR signals are acquired without saturation or being nulled and therefore the method is insensitive to $B_0$ or $B_1$ inhomogeneity and the SNR is relatively high.

In Dixon CSI, first images and second images are acquired. The first MR images are based on first MR signals that include a first echo of a first chemical species and a second chemical species, and the second MR images are based on second MR signals that include a second echo of the first chemical species and the second chemical species. In some embodiments, the first chemical species is water and the second chemical species is fat. The first echo and the second echo have different echo times from one another. Echo time is the time between the excitation RF pulse to the echo, where MR signals are acquired. Protons of a molecule in an MR system have a different resonance frequency, depending on the chemical structure of the molecule. Different echo times provide different phases for signals from different molecules, such as water and fat. Accordingly, the first echo has a first phase difference between the first chemical species and the second chemical species, and the second echo has a second phase difference between the first chemical species and the second chemical species. The first phase difference and the second phase difference are different from each other, due to different echo times. In some embodiments, in-phase images and out-of-phase images are acquired. That is, the first phase difference is zero and the second phase difference is 180°. For example, in in-phase images, MR signals from water and fat are in phase or acquired MR signals are of an in-phase echo of fat and water. In out-of-phase images, MR signals from water and fat are out of phase or acquired MR signals are of an opposed phase echo of fat and water. Fat-only or water-only images are then generated based on the summation and subtraction of the in-phase and out-of-phase images. In some embodiments, more than two acquisitions of MR signals are used. For example, more than two sets of MR signals are acquired, with each set being acquired at a different echo time.

In some embodiments, the systems and methods are applied to multi-channel and/or multi-coil systems. For example, images of each channel or each coil are denoised using deep learning (DL) denoising, and the denoised images are used to improve image quality of the images and/or increase accuracy of measurements or quantification. Neural network model 204 may be used before or after combining data from multi-channels or multi-coils.

In some embodiments, neural network model 204 may be applied to the first image and the second image before the combination. The application may be separate for the first image and the second image. For example, the first image is input into neural network model 204 to derive a denoised first image. The second image is input into neural network model 204 to derive a denoised second image. Alternatively, the application may be joint for the first image and the second image. For example, the first and second images are jointly input into neural network model 204, and denoised first and second images are output from neural network model. Jointly inputting into neural network model 204 may increase accuracy in inference because more information is provided to neural network model 204. After the analysis of neural network model 204, the denoised first image and denoised second image are combined to derive one or more denoised final images.

Combined images may be generated via a linear combination of the first and second images. Alternatively, combined images may be generated via a non-linear combination of the first and second images. For example, in diffusion weighted imaging, first and second images are diffusion weighted images with different diffusion weighting, and the combined images may be maps of apparent diffusion coefficients or diffusion tensors, which are nonlinear combinations of the diffusion weighted images. In another example, in multi-point Dixon CSI, images having different phase differences between a first chemical species and a second chemical species are acquired, and the combined images are nonlinear combinations of the acquired images.

In other embodiments, neural network model 204 may be applied to the combined images of the first and second images. The combined images are input into neural network model 204. If more than one combined image is generated after the combination, the combined images may be input into neural network model separately or jointly. For example, the first combined image and the second combined image are separately input into neural network model 204, and a denoised first combined image and a denoised second combined image are output separately by neural network model 204. Alternatively, the first and second combined images are jointly input into neural network model 204, and denoised first and second combined images are output from neural network model 204. Joint inputs may increase accuracy in inference.

Figure 3A:
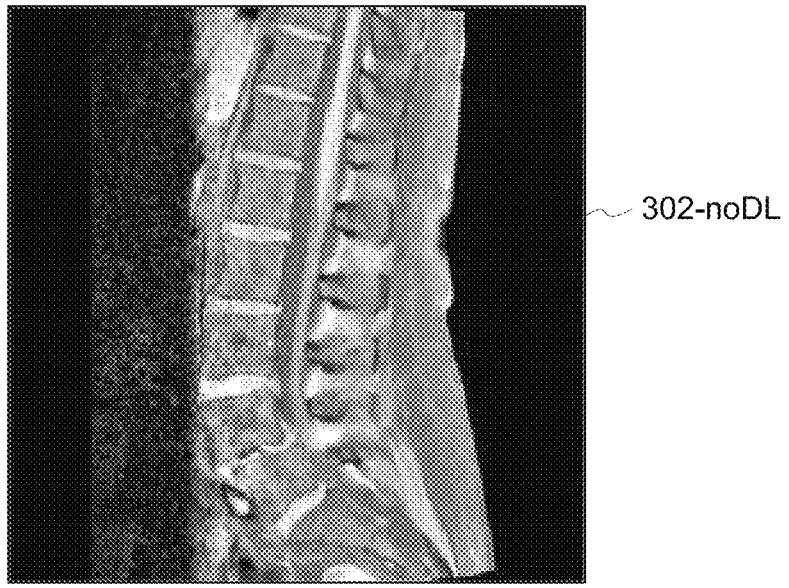
FIG. 3A is an image without using the systems and methods described herein.
Figure 3B:
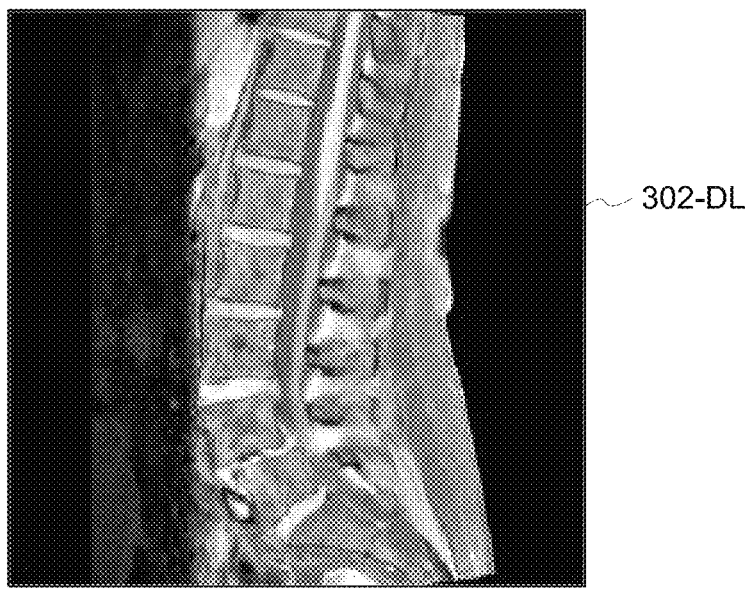
FIG. 3B is an image of the same anatomy location as in FIG. 3A, where the image is generated using an exemplary method described herein.

FIGS. 3A-3B show images 302-noDL, 302-DL without or with applying method 250. Images 302-DL are images processed with systems and methods described herein, while image 302-noDL is not processed with systems and methods described herein. Images 302 are sagittal images of the spinal cord. Specifically, images 302 are water images using Dixon CSI, where fat signals are suppressed. To generate a water image, two or more sets of MR signals are acquired, with each acquired at a different echo time (TE), such that signals from fat and water are at different phases with one another. For example, two sets of MR signals are acquired, the first MR signals are signals from water and fat in-phase with one another while the second MR signals are signals from fat and water being out of phase from one another or having a 180° phase difference. An in-phase image is reconstructed from first MR signals. An out-of-phase image is reconstructed from second MR signals. Because signals from water and fat are in-phase from one another in the in-phase image and have a 180° phase difference in the out-of-phase image, a water-only image and/or a fat-only image may be derived by a linear combination such as an addition or subtraction of the in-phase and out-of-phase images. A water-only image may be referred to as a water image. A fat-only image may be referred to as a fat image. Image 302-noDL is derived by addition of in-phase and out-of-phase images. Image 302-DL is derived by applying neural network model 204. In deriving image 302-DL, neural network model 204 is applied to in-phase and out-of-phase images. Neural network model 204 outputs a denoised in-phase image and a denoised out-of-phase image. The water image 302-DL is derived by addition of the denoised in-phase image and denoised out-of-phase image. A denoised fat-only image (not shown) may be generated by subtraction of the denoised in-phase image with the denoised out-of-phase image.

Compared to other image modalities, MR is unique because the MR signals and MR images are represented by complex numbers at datapoints or pixels. In the exemplary embodiment, inputs and outputs of neural network model are complex images. Complex MR images may be reconstructed based on I and Q quadrature MR signals, using processes such as Fourier transform. Complex MR images $\hat{p}(x,y)$ as used herein are MR images with each pixel represented by a complex number, which has a real component $Re(\hat{p}(x,y))$ and an imaginary component $Im(\hat{p}(x,y))$, where $(x,y)$ is the location of the pixel in an image. Magnitude of a complex MR image, referred to as a magnitude image, is generated as $|\hat{p}(x,y)|=\sqrt{Re(\hat{p}(x,y))^2+Im(\hat{p}(x,y))^2}$. A phase image, phase of a complex MR image, may also be generated and used, where phase $$\Phi(x, y) = \tan^{-1}\left(\frac{Im(\hat{p}(x, y))}{Re(\hat{p}(x, y))}\right).$$

A real image is an MR image with the value at each pixel as the real component $Re(\hat{p}(x,y))$. An imaginary image is an MR image with the value at each pixel as the imaginary component $Im(\hat{p}(x,y))$.

In the exemplary embodiment, to analyze a water image using neural network model 204, the water-only image includes phase information, and is provided as a complex MR image, a pair of a magnitude image and a phase image, real and imaginary pairs, or images in a phasor representation. Although final displayed image is a magnitude image, the phases of the water-only image are added back and provided to neural network model 204.

Applying systems and methods described herein to two-point Dixon CSI is described as an example for illustration purpose only. Systems and methods may be applied to multiple-point Dixon CSI. In three or more point Dixon CSIs, three or more sets of MR signals are acquired, with each set having a different TE such that signals from water and fat have a different phase difference for each set. The water-only and fat-only images are generated based on the multiple sets of MR signals. Neural network model 204 may be applied before or after combination.

In Dixon CSI, the in-phase image and out-of-phase image have different noise distribution across the image. For example, SNRs of the fat region are different between the in-phase image and the out-of-phase image. Compared to the out-of-phase image, in an in-phase image, the fat signal is relatively high because fat and water are in phase, and therefore the SNR is high in the fat region while in the spinal cord region, the SNR is low. Neural network model 204 is configured to remove noise while preserving the structures. As a result, more noise is removed in the spinal cord region than the fat region after the in-phase image is analyzed by neural network model 204, and the denoised in-phase image retains noise in the fat region. On the other hand, in the out-of-phase image, because fat is out of phase with water, the fat region also has low SNR like the spinal cord region, and therefore noise in the fat region is reduced in the denoised out-of-phase image after the out-of-phase image is analyzed by neural network model 204. Consequently, in water image 302-DL, which is the combination of the denoised in-phase image and the denoised out-of-phase image, noise is retained in fat region, causing artifacts.

The artifacts may be reduced by combining the first and second images before the analysis by neural network model 204. For example, the acquired in-phase and out-of-phase images are combined to generate a water-only image and a fat-only image, and the water-only image and the fat-only images are analyzed, separately or jointly, by neural network model 204 to derive a denoised water-only image and/or a denoised fat-only image. Neural network model 204 performs a nonlinear operation to input images, and noise may not be propagated uniformly across an image during the analysis by neural network model 204. Accordingly, when original images are combined before being analyzed by neural network model 204, neural network model will not affect noise in the original images differently, thereby reducing artifacts.

2D images are used as examples for illustration purposes only. Systems and methods described herein may be applied to 3D MR datasets. A 2D neural network model 204 may be used to analyze 3D images. For example, 2D neural network model 204 is provided with 2D images as inputs and outputs 2D images. To process 3D images using a 2D neural network model 204, 3D images may be organized a plurality of 2D images in the z or kz direction, and 2D images are input into 2D neural network model 204 to be analyzed. The outputs are organized into 3D images. Alternatively, a 3D neural network model 204 that takes 3D images as inputs and outputs 3D images is used to analyze the 3D images.

As described above, an MR image may be reconstructed by Fourier transform. Because Fourier transform is a linear operation, in some embodiments, the inputs to neural network model 204 and/or outputs from neural network model are MR signals, MR images, or any combination thereof.

Figure 4A:
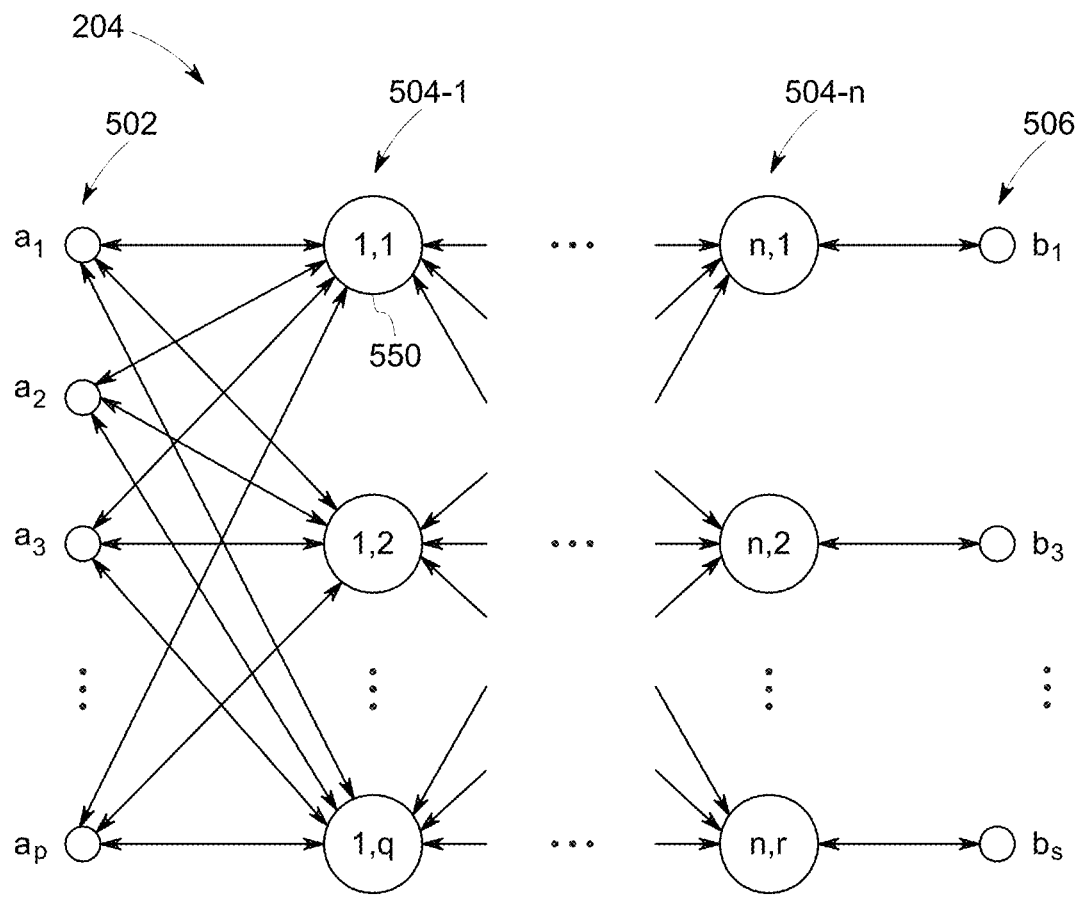
FIG. 4A is a schematic diagram of a neural network model.

FIG. 4A depicts an exemplary artificial neural network model 204. The exemplary neural network model 204 includes layers of neurons 502, 504-1 to 504-$n$, and 506, including an input layer 502, one or more hidden layers 504-1 through 504-$n$, and an output layer 506. Each layer may include any number of neurons, i.e., q, r, and n in FIG. 4A may be any positive integer. It should be understood that neural networks of a different structure and configuration from that depicted in FIG. 4A may be used to achieve the methods and systems described herein.

In the exemplary embodiment, the input layer 502 may receive different input data. For example, the input layer 502 includes a first input $a_1$ representing training images, a second input $a_2$ representing patterns identified in the training images, a third input $a_3$ representing edges of the training images, and so on. The input layer 502 may include thousands or more inputs. In some embodiments, the number of elements used by the neural network model 204 changes during the training process, and some neurons are bypassed or ignored if, for example, during execution of the neural network, they are determined to be of less relevance.

In the exemplary embodiment, each neuron in hidden layer(s) 504-1 through 504-$n$ processes one or more inputs from the input layer 502, and/or one or more outputs from neurons in one of the previous hidden layers, to generate a decision or output. The output layer 506 includes one or more outputs each indicating a label, confidence factor, weight describing the inputs, and/or an output image. In some embodiments, however, outputs of the neural network model 204 are obtained from a hidden layer 504-1 through 504-$n$ in addition to, or in place of, output(s) from the output layer(s) 506.

In some embodiments, each layer has a discrete, recognizable function with respect to input data. For example, if n is equal to 3, a first layer analyzes the first dimension of the inputs, a second layer the second dimension, and the final layer the third dimension of the inputs. Dimensions may correspond to aspects considered strongly determinative, then those considered of intermediate importance, and finally those of less relevance.

In other embodiments, the layers are not clearly delineated in terms of the functionality they perform. For example, two or more of hidden layers 504-1 through 504-$n$ may share decisions relating to labeling, with no single layer making an independent decision as to labeling.

Figure 4B:
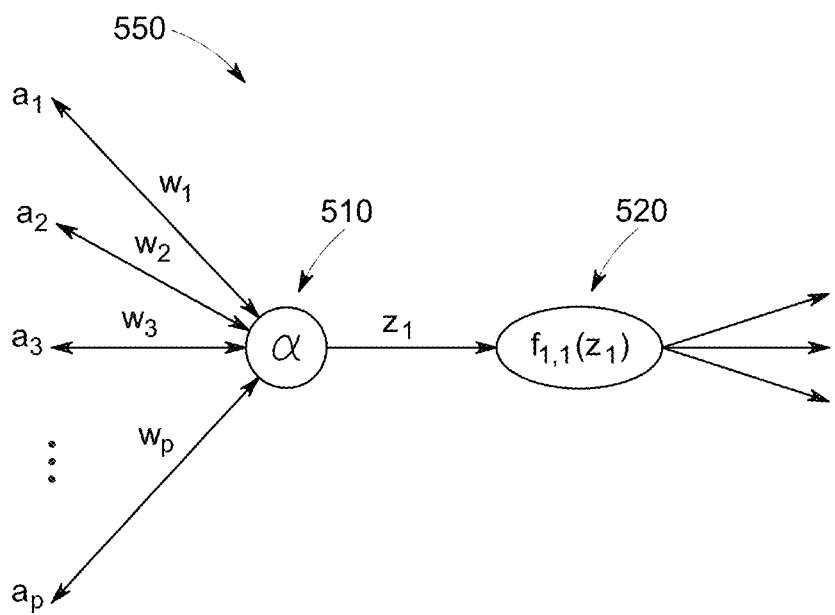
FIG. 4B is a schematic diagram of a neuron in the neural network model shown in FIG. 4A.

FIG. 4B depicts an example neuron 550 that corresponds to the neuron labeled as "1,1" in hidden layer 504-1 of FIG. 4A, according to one embodiment. Each of the inputs to the neuron 550 (e.g., the inputs in the input layer 502 in FIG. 4A) is weighted such that input $a_1$ through $a_p$ corresponds to weights $w_1$ through $w_p$ as determined during the training process of the neural network model 204.

In some embodiments, some inputs lack an explicit weight, or have a weight below a threshold. The weights are applied to a function a (labeled by a reference numeral 510), which may be a summation and may produce a value $z_1$ which is input to a function 520, labeled as $f_{1,1}(z_1)$. The function 520 is any suitable linear or non-linear function. As depicted in FIG. 4B, the function 520 produces multiple outputs, which may be provided to neuron(s) of a subsequent layer, or used as an output of the neural network model 204. For example, the outputs may correspond to index values of a list of labels, or may be calculated values used as inputs to subsequent functions.

It should be appreciated that the structure and function of the neural network model 204 and the neuron 550 depicted are for illustration purposes only, and that other suitable configurations exist. For example, the output of any given neuron may depend not only on values determined by past neurons, but also on future neurons.

The neural network model 204 may include a convolutional neural network (CNN), a deep learning neural network, a reinforced or reinforcement learning module or program, or a combined learning module or program that learns in two or more fields or areas of interest. Supervised and unsupervised machine learning techniques may be used. In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. The neural network model 204 may be trained using unsupervised machine learning programs. In unsupervised machine learning, the processing element may be required to find its own structure in unlabeled example inputs. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics, and information. The machine learning programs may use deep learning algorithms that may be primarily focused on pattern recognition, and may be trained after processing multiple examples. The machine learning programs may include Bayesian Program Learning (BPL), voice recognition and synthesis, image or object recognition, optical character recognition, and/or natural language processing-either individually or in combination. The machine learning programs may also include natural language processing, semantic analysis, automatic reasoning, and/or machine learning.

Based upon these analyses, the neural network model 204 may learn how to identify characteristics and patterns that may then be applied to analyzing image data, model data, and/or other data. For example, the model 204 may learn to identify features in a series of data points.

Figure 5:
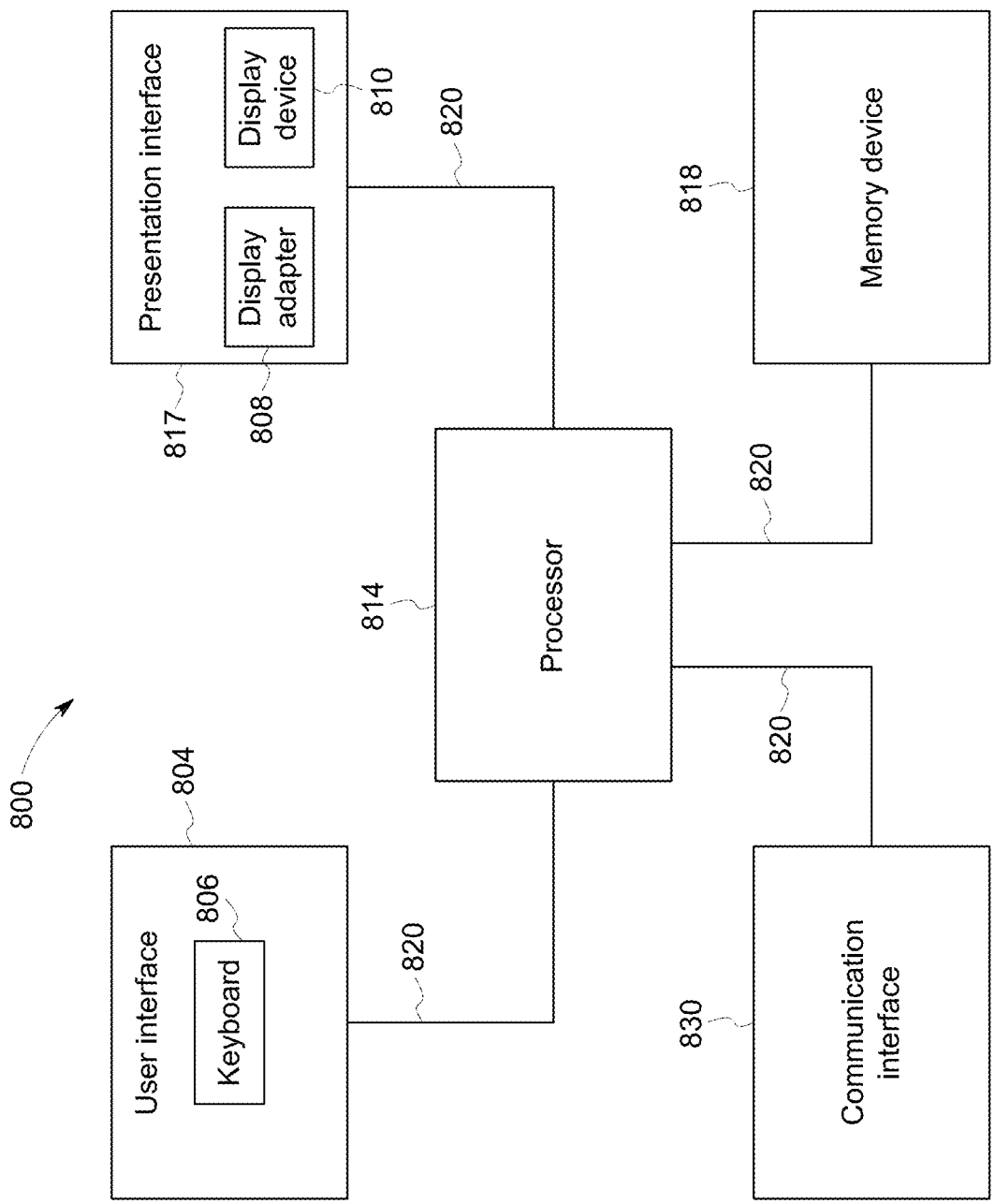
FIG. 5 is a block diagram of an exemplary computing device.

Workstation 12 and noise reduction computing device 202 described herein may be any suitable computing device 800 and software implemented therein. FIG. 5 is a block diagram of an exemplary computing device 800. In the exemplary embodiment, computing device 800 includes a user interface 804 that receives at least one input from a user. User interface 804 may include a keyboard 806 that enables the user to input pertinent information. User interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 that presents information, such as input events and/or validation results, to the user. Presentation interface 817 may also include a display adapter 808 that is coupled to at least one display device 810. More specifically, in the exemplary embodiment, display device 810 may be a visual display device, such as a cathode ray tube (CRT), a liquid crystal display (LCD), a light-emitting diode (LED) display, and/or an "electronic ink" display. Alternatively, presentation interface 817 may include an audio output device (e.g., an audio adapter and/or a speaker) and/or a printer.

Computing device 800 also includes a processor 814 and a memory device 818. Processor 814 is coupled to user interface 804, presentation interface 817, and memory device 818 via a system bus 820. In the exemplary embodiment, processor 814 communicates with the user, such as by prompting the user via presentation interface 817 and/or by receiving user inputs via user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, memory device 818 includes one or more devices that enable information, such as executable instructions and/or other data, to be stored and retrieved. Moreover, memory device 818 includes one or more computer readable media, such as, without limitation, dynamic random access memory (DRAM), static random access memory (SRAM), a solid state disk, and/or a hard disk. In the exemplary embodiment, memory device 818 stores, without limitation, application source code, application object code, configuration data, additional input events, application states, assertion statements, validation results, and/or any other type of data. Computing device 800, in the exemplary embodiment, may also include a communication interface 830 that is coupled to processor 814 via system bus 820. Moreover, communication interface 830 is communicatively coupled to data acquisition devices.

In the exemplary embodiment, processor 814 may be programmed by encoding an operation using one or more executable instructions and providing the executable instructions in memory device 818. In the exemplary embodiment, processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 6:
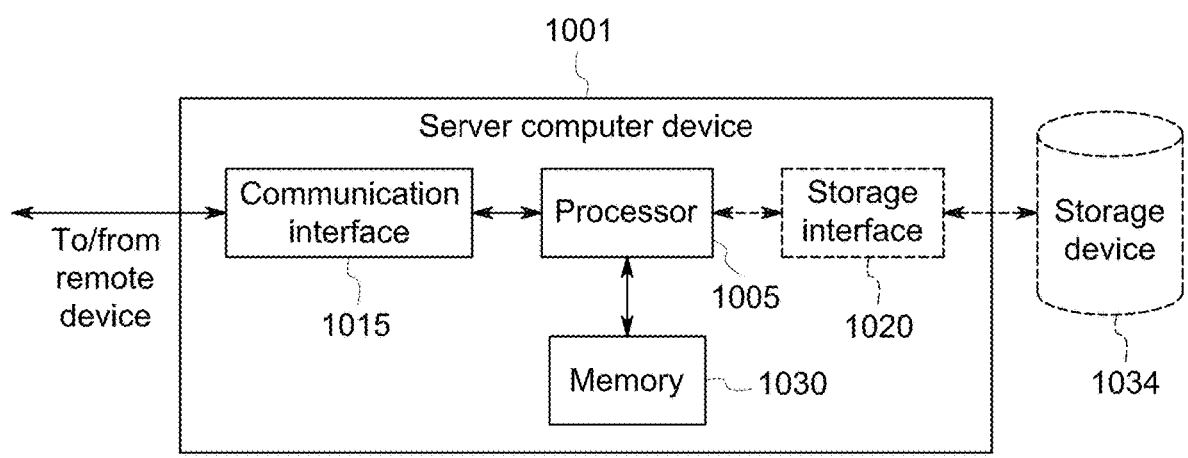
FIG. 6 is a block diagram of an exemplary server computing device.

FIG. 6 illustrates an exemplary configuration of a server computer device 1001 such as computing device 202. Server computer device 1001 also includes a processor 1005 for executing instructions. Instructions may be stored in a memory area 1030, for example. Processor 1005 may include one or more processing units (e.g., in a multi-core configuration).

Processor 1005 is operatively coupled to a communication interface 1015 such that server computer device 1001 is capable of communicating with a remote device or another server computer device 1001. For example, communication interface 1015 may receive data from workstation 12, via the Internet.

Processor 1005 may also be operatively coupled to a storage device 1034. Storage device 1034 is any computer-operated hardware suitable for storing and/or retrieving data, such as, but not limited to, wavelength changes, temperatures, and strain. In some embodiments, storage device 1034 is integrated in server computer device 1001. For example, server computer device 1001 may include one or more hard disk drives as storage device 1034. In other embodiments, storage device 1034 is external to server computer device 1001 and may be accessed by a plurality of server computer devices 1001. For example, storage device 1034 may include multiple storage units such as hard disks and/or solid state disks in a redundant array of inexpensive disks (RAID) configuration. storage device 1034 may include a storage area network (SAN) and/or a network attached storage (NAS) system.

In some embodiments, processor 1005 is operatively coupled to storage device 1034 via a storage interface 1020. Storage interface 1020 is any component capable of providing processor 1005 with access to storage device 1034. Storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1005 with access to storage device 1034.

At least one technical effect of the systems and methods described herein includes (a) reduction of noise in derived MR images; (b) training datasets of a neural network model being different from datasets during inference; and (c) reduction of noise in fat suppressed Dixon images.

Exemplary embodiments of systems and methods of noise reduction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method of reducing noise in magnetic resonance (MR) images, comprising:
   executing a neural network model of analyzing MR images, wherein the neural network model is trained with a pair of pristine images and corrupted images, wherein the pristine images are the corrupted images with noise reduced, and target output images of the neural network model are the pristine images;
   receiving first MR signals of a portion of a subject and second MR signals of the portion of the subject, the first MR signals and the second MR signals acquired using a pulse sequence of an MR system;
   reconstructing a first MR image and a second MR image based on the first MR signals and the second MR signals, the first MR image and the second MR image being MR images of the portion of the subject;
   analyzing the first MR image and the second MR image using the neural network model;
   deriving a denoised MR image based on the analysis, wherein the denoised MR image is a combined image based on the first MR image and the second MR image; and
   outputting the denoised MR image.

2. The method of claim 1, wherein executing a neural network model further comprises executing the neural network model, wherein an input of the neural network model includes a complex image.

3. The method of claim 1, wherein the first MR image has a different noise distribution from the second MR image.

4. The method of claim 1, wherein receiving first MR signals and second MR signals further comprises:
   receiving the first MR signals and the second MR signals, wherein the first MR signals are signals of a first echo of a first chemical species and a second chemical species, the second MR signals are signals of a second echo of the first chemical species and the second chemical species, wherein the first echo and the second echo have different echo times.

5. The method of claim 4, wherein the first echo is an in-phase echo of the first chemical species and the second chemical species, and the second echo is an out-of-phase echo of the first chemical species and the second chemical species.

6. The method of claim 4, wherein the first chemical species comprises water, and the second chemical species comprises fat.

7. The method of claim 1, wherein:
   reconstructing a first MR image and a second MR image further comprises:
     reconstructing the first MR image based on the first MR signals; and
     reconstructing the second MR image based on the second MR signals;
   analyzing the first MR image and the second MR image further comprises:
     combining the first MR image and the second MR image into a third image; and
     analyzing the third image using the neural network model; and
   deriving a denoised MR image further comprises:
     deriving the denoised MR image based on the analysis of the third image.

8. The method of claim 1, wherein:
   reconstructing a first MR image and a second MR image further comprises:
     reconstructing the first MR image based on the first MR signals; and
     reconstructing the second MR image based on the second MR signals;
   analyzing the first MR image and the second MR image further comprises:
     analyzing the first MR image using the neural network model to derive a first denoised MR image; and
     analyzing the second MR image using the neural network model to derive a second denoised MR image; and
   deriving a denoised MR image further comprises:
     deriving the denoised MR image by combining the first denoised MR image and the second denoised MR image.

9. The method of claim 1, wherein:
   reconstructing a first MR image and a second MR image further comprises:
     reconstructing the first MR image based on the first MR signals; and
     reconstructing the second MR image based on the second MR signals;
   analyzing the first MR image and the second MR image further comprises:
     jointly analyzing the first MR image and the second MR image using the neural network model; and
   deriving a denoised MR image further comprises:
     deriving the denoised MR image based on the joint analysis of the first MR image and the second MR image.

10. The method of claim 1, wherein receiving first MR signals and second MR signals further comprises receiving first MR signals and second MR signals acquired with a multi-channel MR system.

11. The method of claim 1, wherein the neural network model is configured to analyze three-dimensional (3D) MR datasets.

12. A magnetic resonance (MR) noise reduction system, comprising a noise reduction computing device, the noise reduction computing device comprising at least one processor in communication with at least one memory device, and the at least one processor programmed to:
   execute a neural network model of analyzing MR images, wherein the neural network model is trained with a pair of pristine images and corrupted images, wherein the pristine images are the corrupted images with noise reduced, and target output images of the neural network model are the pristine images;

receive first MR signals of a portion of a subject and second MR signals of the portion of the subject, the first MR signals and the second MR signals acquired using a pulse sequence of an MR system;

reconstruct a first MR image and a second MR image based on the first MR signals and the second MR signals, the first MR image and the second MR image being MR images of the portion of the subject;

analyze the first MR image and the second MR image using the neural network model;

derive a denoised MR image based on the analysis, wherein the denoised MR image is a combined image based on the first MR image and the second MR image; and output the denoised MR image.

13. The system of claim 12, wherein the at least one processor is further programmed to:

execute the neural network model, wherein an input of the neural network model includes a complex image.

14. The system of claim 12, wherein the first MR image has a different noise distribution from the second MR image.

15. The system of claim 12, wherein the at least one processor is further programmed to:

receive the first MR signals and the second MR signals, wherein the first MR signals are signals of a first echo of a first chemical species and a second chemical species, the second MR signals are signals of a second echo of the first chemical species and the second chemical species, wherein the first echo and the second echo have different echo times.

16. The system of claim 15, wherein the first echo is an in-phase echo of the first chemical species and the second chemical species, and the second echo is an out-of-phase echo of the first chemical species and the second chemical species.

17. The system of claim 15, wherein the first chemical species comprises water, and the second chemical species comprises fat.

18. The system of claim 12, wherein the at least one processor is further programmed to:

reconstruct the first MR image based on the first MR signals;

reconstruct the second MR image based on the second MR signals;

combine the first MR image and the second MR image into a third image;

analyze the third image using the neural network model; and derive the denoised MR image based on the analysis of the third image.

19. The system of claim 12, wherein the at least one processor is further programmed to:

reconstruct the first MR image based on the first MR signals;

reconstruct the second MR image based on the second MR signals;

analyze the first MR image using the neural network model to derive a first denoised MR image;

analyze the second MR image using the neural network model to derive a second denoised MR image; and derive the denoised MR image by combining the first denoised MR image and the second denoised MR image.

20. The system of claim 12, wherein the at least one processor is further programmed to:

jointly analyze the first MR image and the second MR image using the neural network model; and derive the denoised MR image based on the joint analysis of the first MR image and the second MR image.

* * * * *